US011670479B2

(12) United States Patent
Ohashi et al.

(10) Patent No.: US 11,670,479 B2
(45) Date of Patent: Jun. 6, 2023

(54) ELECTRON MICROSCOPE AND METHOD OF ADJUSTING FOCUS OF ELECTRON MICROSCOPE

(71) Applicant: Hitachi High-Tech Corporation, Tokyo (JP)

(72) Inventors: Takeyoshi Ohashi, Tokyo (JP); Hyejin Kim, Tokyo (JP); Yusuke Abe, Tokyo (JP); Kenji Tanimoto, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 177 days.

(21) Appl. No.: 17/338,353

(22) Filed: Jun. 3, 2021

(65) Prior Publication Data
US 2021/0384006 A1   Dec. 9, 2021

(30) Foreign Application Priority Data
Jun. 5, 2020   (JP) .............................. JP2020-098163

(51) Int. Cl.
*H01J 37/28* (2006.01)
*H01J 37/21* (2006.01)
(Continued)

(52) U.S. Cl.
CPC ............ *H01J 37/21* (2013.01); *G06T 1/0007* (2013.01); *G06T 7/73* (2017.01); *H01J 37/145* (2013.01);
(Continued)

(58) Field of Classification Search
CPC ........ H01J 37/21; H01J 37/145; H01J 37/222; H01J 2237/216; H01J 37/12; H01J 37/20;
(Continued)

(56) References Cited

U.S. PATENT DOCUMENTS 5,594,245 A   1/1997   Todokoro
6,521,891 B1   2/2003   Dotan et al.
(Continued)

FOREIGN PATENT DOCUMENTS

JP   H11135052 A   5/1999
JP   2001236915 A   8/2001
(Continued)

OTHER PUBLICATIONS

Tanaka, H., et al., "Bit-Cost Scalable Technology for Low-Cost and Ultrahigh-Density Flash Memory", Toshiba Review, vol. 63, 28 (2008).
(Continued)

*Primary Examiner* — Howard D Brown, Jr.
(74) *Attorney, Agent, or Firm* — Miles & Stockbridge, P.C.

(57) ABSTRACT

When focus adjustment is performed according to the height of the surface of a sample at each inspection point in order to continuously inspect a plurality of inspection points on a wafer by using an electron microscope, even when the focus adjustment by an electrostatic lens in which a variation of heights of inspection points is greater than a predetermined range, and that can perform adjustment at a high speed and adjustment by an electromagnetic lens with a low speed are required to be used together, a flow of focus adjustment in which the number of times of the adjustment by the electromagnetic lens is reduced by using a relation of changes of heights at inspection points, an inspection order, and a range in which an electrostatic focus can be performed is realized, so that inspection with high throughput is made possible.

17 Claims, 23 Drawing Sheets

(51) Int. Cl.
    *G06T 1/00* (2006.01)
    *G06T 7/73* (2017.01)
    *H01J 37/145* (2006.01)
    *H01J 37/22* (2006.01)
(52) U.S. Cl.
    CPC ........ *H01J 37/222* (2013.01); *G06T 2200/24* (2013.01); *G06T 2207/10056* (2013.01); *G06T 2207/30148* (2013.01)
(58) Field of Classification Search
    CPC .......... H01J 37/28; G06T 1/0007; G06T 7/73; G06T 2200/24; G06T 2207/10056; G06T 2207/30148
    See application file for complete search history.

(56) References Cited

U.S. PATENT DOCUMENTS

| | | | |
|---|---|---|---|
| 6,653,634 | B1 | 11/2003 | Otaka et al. |
| 9,644,955 | B2 * | 5/2017 | Yano ........................ H01L 22/12 |
| 2002/0056808 | A1 | 5/2002 | Tsuneta |
| 2006/0038125 | A1 | 2/2006 | Tsuneta |
| 2008/0073528 | A1 * | 3/2008 | Sasaki ..................... H01J 37/28 250/307 |
| 2008/0203298 | A1 | 8/2008 | Ishijima et al. |
| 2009/0140143 | A1 | 6/2009 | Fukuda |
| 2009/0212214 | A1 | 8/2009 | Kimba |
| 2014/0339425 | A1 | 11/2014 | Yano et al. |
| 2019/0019651 | A1 | 1/2019 | Maruyama |
| 2019/0035596 | A1 * | 1/2019 | Takeuchi ................. H01J 37/06 |
| 2021/0384006 | A1 * | 12/2021 | Ohashi .................... H01J 37/21 |

FOREIGN PATENT DOCUMENTS

| | | |
|---|---|---|
| JP | 2008151797 A | 7/2008 |
| JP | 2013125583 A | 6/2013 |
| JP | 2019-008873 A2 | 1/2019 |
| KR | 10-2008-0011304 A | 2/2008 |

OTHER PUBLICATIONS

Kim, J., et al., "Novel Vertical-Stacked-Array-Transistor (VSAT) for ultra-high-density and cost-effective NAND Flash memory devices and SSD (Solid State Drive)", VLSI Tech. Dig., 186 (2009).

Hisamoto, D., et al., "Impact of the Vertical SOI "Delta" Structure on Planar Device Technology", IEEE Transactions on Electron Devices, 38, 1419 (1991).

Office Action dated Nov. 28, 2022 in Korean Application No. 10-2021-0060504.

* cited by examiner

FIG. 2

| INSPECTION POINT NUMBER | POSITION X (μm) | POSITION Y (μm) | HEIGHT Z (μm) |
|---|---|---|---|
| 1 | 0 | 0 | 16 |
| 2 | 0 | 500 | 40 |
| 3 | 500 | 0 | 20 |
| 4 | 500 | 500 | 42 |
| 5 | 1000 | 0 | 24 |
| 6 | 1000 | 500 | 45 |
| ... | ... | ... | ... |

FIG. 3

| ACCELERATION VOLTAGE (kV) | FOCUS ADJUSTMENT WIDTH h (μm) |
|---|---|
| 5 | 20 |
| 10 | 10 |
| 15 | 5 |
| ⋯ | ⋯ |

FIG. 4

| INSPECTION POINT NUMBER | INSPECTION ORDER |
|---|---|
| 1 | 1 |
| 2 | 2 |
| 3 | 3 |
| 4 | 4 |
| 5 | 5 |
| 6 | 6 |
| ............ | ............ |

FIG. 5

| INSPECTION DATE AND TIME | INSPECTION ORDER | INSPECTION POINT NUMBER | POSITION X (μm) | POSITION Y (μm) | HEIGHT MEASURED VALUE $Z_1$ (μm) | HEIGHT DIFFERENCE $\Delta Z$ (μm) | FOCUS ADJUSTMENT MEANS | REQUIRED TIME (SECOND) |
|---|---|---|---|---|---|---|---|---|
| 12:12 JANUARY 1, 2020 | 1 | 1 | 0 | 0 | 16 | 0.7 | OBJECTIVE + ELECTROSTATIC | 1.9 |
| | 2 | 3 | 500 | 0 | 20 | 0.2 | ELECTROSTATIC | 0.6 |
| | 3 | 5 | 1000 | 0 | 24 | 1.0 | ELECTROSTATIC | 0.6 |
| | 4 | 2 | 0 | 2000 | 40 | 1.8 | OBJECTIVE + ELECTROSTATIC | 2.0 |
| | 5 | 4 | 500 | 2000 | 42 | 0.1 | ELECTROSTATIC | 0.6 |
| | 6 | 6 | 1000 | 2000 | 45 | 0.2 | ELECTROSTATIC | 0.6 |
| | ..... | ..... | ..... | ..... | ..... | ..... | ..... | ..... |
| 12:23 JANUARY 1, 2020 | | | | | | | | |
| ........ | | | | | | | | |

FIG. 23

| ACCELERATION VOLTAGE (kV) | FOCUS ADJUSTMENT WIDTH h (μm) | THROUGH FOCUS ALLOWABLE WIDTH h' (μm) |
|---|---|---|
| 5 | 20 | 30 |
| 10 | 10 | 20 |
| 15 | 5 | 10 |
| ................ | ................ | ................ |

ELECTRON MICROSCOPE AND METHOD OF ADJUSTING FOCUS OF ELECTRON MICROSCOPE

CLAIM OF PRIORITY

The present application claims priority from Japanese Patent application serial no. 2020-098163, filed on Jun. 5, 2020, the content of which is hereby incorporated by reference into this application.

BACKGROUND OF THE INVENTION

1. Field of the Invention

The present invention relates to an electron beam application device such as an electron microscope that acquires an image of a sample and performs inspection, measurement, and observation by using electron beams, and a method of adjusting focus of an electron microscope or the like.

2. Description of Related Art

The electron microscope is a device that irradiates a sample with an electron beam, detects a signal generated from the sample to acquire an image, and inspects, measures, and observes the sample. Among the electron microscopes, a scanning electron microscope (SEM) accelerates an electron beam emitted from an electron source, and causes the electron beam to converge (focus) on a minute spot diameter by a lens such as an electromagnetic lens or an electrostatic lens to irradiate a sample surface while scanning. The electron beam applied to a sample is referred to as a primary electron beam (primary electron beam). A signal electron is emitted from a sample by the incidence of the primary electron beam. An image such as a fine pattern on a sample can be obtained by deflecting a primary electron beam to irradiate the sample while scanning, and detecting a signal electron emitted from the sample to correspond to a position irradiated by the primary electron beam. In order to obtain high spatial resolution in the acquired image, it is required to cause the primary electron beam to converge on a sufficiently minute spot diameter on the sample, when the sample is irradiated.

The convergence (focus) on the sample by the primary electron beam can be adjusted by the electromagnetic lens, the electrostatic lens, and the height of a stage holding the sample. That is, by changing the amount of the electric current of a coil of an electromagnetic lens, the voltage of an electrode of an electrostatic lens, and the height of a sample stage, the height (hereinafter, referred to as a focus position or a focus height) of the convergence point of the primary electron beam and the height of the sample surface can be adjusted to coincide with each other. Such adjustment is referred to as focus adjustment. By performing focus adjustment, an SEM image with the high resolution can be obtained.

JP-A-2013-125583 discloses a method in which coarse adjustment of focus is performed by adjusting the height of a sample and the like, and fine adjustment is performed by an electrostatic lens.

SUMMARY OF THE INVENTION

When an electron microscope is applied to the inspection of a semiconductor device or the like, it is required to observe a plurality of observation points of the same sample (wafer), the plurality of observation points in the wafer needs to be observed with high throughput. Since the height of the sample is different at a different observation point as described below, focus adjustment is required for each observation point, and it is extremely important to shorten this focus adjustment time in order to perform sequence of observing the entire observation points in a wafer with high throughput.

Generally, the focus adjustment (electromagnetic focus) by an electromagnetic lens using a magnetic field generated by the electromagnetic coil is low speed, because the lens electric current changes slow due to the inductance of coil. Meanwhile, focus adjustment (electrostatic focus) by an electrostatic lens using an electric field by an electrode is performed by changing a voltage and thus has high speed. Therefore, in order to shorten the focus adjustment time, it is desirable to perform adjustment by an electrostatic lens as much as possible. However, if a height range which can be adjusted by the electrostatic lens (focus adjustment width) is limited to a small amount when an acceleration voltage of a primary electron beam is high or the like, the variation of the heights of the entire observation points in the sample may be greater than the focus adjustment width. Here, the entire observation points in the wafer cannot be adjusted only with the electrostatic focus, and the electromagnetic focus by the electromagnetic lens designed to have a larger focus adjustment width is required to be used together. Therefore, in order to perform inspection with high throughput, it is required to reduce the number of times of the electromagnetic focus with a low speed to a minimum.

The method disclosed in JP-A-2013-125583 is a method of combining a plurality of kinds of focus adjustment means (types), but improvement of throughput by reducing the number of times of specific focus adjustment means (type) is not considered.

According to the present invention, an electron microscope includes: an electron source that emits a primary electron beam; a lens that focuses the primary electron beam; a first focus adjustment unit that adjusts a height of a focus position of the primary electron beam; a second focus adjustment unit that adjusts the height of the focus position of the primary electron beam and is different from the first focus adjustment unit; a stage on which a sample is placed; a detector that detects a signal generated from the sample by the irradiation of the sample with the primary electron beam; and a control unit, in which the control unit includes an image generation unit that generates an image from the signal acquired by the detector, an image acquisition point height information storage unit that stores height information of a surface at a plurality of image acquisition points of the sample, and a focus adjustment width storage unit that stores a focus adjustment width that can be adjusted by the first focus adjustment unit, and a focus adjustment amount is determined by the second focus adjustment unit based on the height information and the focus adjustment width of the sample.

When focus is adjusted according to the height of the surface of a sample at each image acquirement (inspection) point in order to continuously perform image acquirement (inspection) on a plurality of image acquirement (inspection) points of the sample such as a wafer by using an electron microscope, in a case where the primary electron beam is the high acceleration condition, or the like, even if the width in which the focus can be adjusted by the electrostatic lens is limited, and the variation of the heights of the entire image acquirement (inspection) points in the wafer is greater than the focus adjustment width, inspection, measurement, observation, and the like with high throughput can be realized by reducing the number of times of the adjustment by the electromagnetic lens with a low speed.

Other issues and new features are apparent from the description of the present specification and accompanying drawings herein.

BRIEF DESCRIPTION OF THE DRAWINGS

FIG. 2 is a diagram illustrating an example of information stored in an image acquisition point height information storage unit according to Embodiments 1 to 6;

FIG. 3 is a diagram illustrating an example of information stored in a focus adjustment width storage unit according to Embodiments 1 to 5;

FIG. 4 is a diagram illustrating an example of information stored in an image acquisition order storage unit according to Embodiments 1 to 6;

FIG. 5 is a diagram illustrating an example of information stored in result accumulation database according to Embodiments 1 to 6;

FIG. 23 is a diagram illustrating an example of information stored in a focus adjustment width storage unit according to Embodiment 6.

DESCRIPTION OF EMBODIMENTS

Hereinafter, embodiments of the present invention are described in detail with reference to drawings using a scanning electron microscope (SEM) as an example. However, techniques shown in the following embodiments can be applied to electron beam devices other than SEM.

Figure 1:
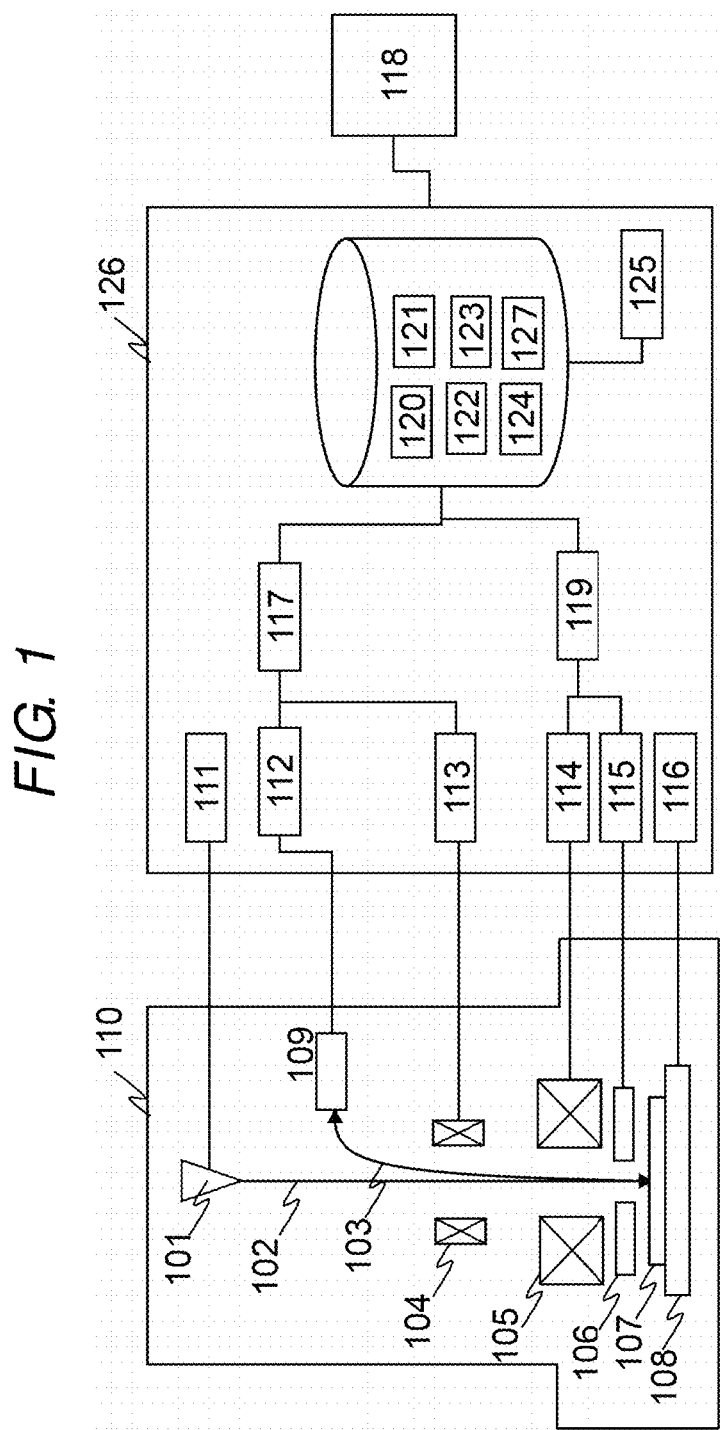
FIG. 1 is a diagram of the entire configuration of an electron microscope according to Embodiments 1 to 6.

FIG. 1 illustrating the configuration of the SEM described below is described in detail in Embodiment 1, but illustrates components according to not only Embodiment 1 but also Embodiments 1 to 6. Therefore, not all components are required in some embodiments.

Embodiment 1

FIG. 1 illustrates the entire configuration of a scanning electron microscope (SEM) according to Embodiment 1. As described above, the configurations of the SEM of FIG. 1 are also the same in Embodiments 2 to 6. The SEM includes a column unit 110 that is a hard configuration and a control unit 126 that controls the configuration.

An electron source 101 emits a primary electron beam 102, and the emitted primary electron beam 102 passes through a deflector 104, an objective lens 105, and an electrostatic lens 106 and converges so that a sample 107 such as a semiconductor wafer is scanned and irradiated. Here, the objective lens 105 is an electromagnetic lens. The electron source 101, the deflector 104, the objective lens 105, and the electrostatic lens 106 are controlled by an electron source control unit 111, a deflector control unit 113, an objective lens control unit 114, and an electrostatic lens control unit 115 of the control unit 126, respectively. Due to the irradiation with the primary electron beam 102, a signal electron 103 is emitted from the sample 107, detected by a detector 109, and processed by a detection signal processing unit 112. The primary electron beam 102 is deflected by the deflector 104 so that the surface of the sample 107 is scanned, and an image generation unit 117 can generate an image in synchronization with a control signal of the deflector control unit 113 that applies an output signal of the detection signal processing unit 112 to the deflector 104 and output the image to an output device 118 as an SEM image or store the image in an image storage unit 120 as image data.

The sample 107 is held on a stage 108, and the stage 108 can be moved by a stage control unit 116. Accordingly, the field of view of the sample 107 is moved so that a desired point on the surface can be irradiated with the primary electron beam 102 to acquire an SEM image. Hereinafter, the irradiation point of an electron beam 102 on the sample 107 is referred to as an image acquisition point. The image acquisition point means an inspection point, a measurement point, or the like for the use of the inspection, measurement, or the like described below. The movement of the field of view of the primary electron beam 102 can be realized not only by the stage 108 but also by deflecting the primary electron beam 102 by using a deflector (not illustrated) for the movement of a field of view.

The control unit 126 further includes a focus control unit 119. The focus control unit 119 changes an electric current of a coil of the objective lens 105 by the objective lens control unit 114 or changes a voltage of an electrode of the electrostatic lens 106 by the electrostatic lens control unit 115 so that a position of the convergence of the primary electron beam 102 in a height direction (hereinafter, referred to as a focus position or a focus height) is caused to coincide with the height of the surface of the sample 107. If the height of the surface of the sample 107 can be estimated, the setting value of the electric current of the objective lens 105 or the voltage of the electrostatic lens 106 can be calculated from the sample surface height by using a calibration curve prepared in advance. However, usually, it is difficult to estimate the sample surface height with sufficiently accuracy, thus the focus height and the sample surface height do not coincide with each other, and an error (focus error) occurs. Even when the sample is charged, the focus height of the primary electron beam 102 changes due to the charges, and the focus error occurs.

When the height of the surface of the sample 107 cannot be estimated or when the focus error occurs, the following through focus adjustment is performed. The through focus adjustment is to acquire an SEM image while the electric current of the objective lens 105 is changed by the objective lens control unit 114 or while the voltage of the electrostatic lens 106 is changed by the electrostatic lens control unit 115, determine an optimum electric current or an optimum voltage in which the SEM image is the sharpest, and set the electric current of the objective lens 105 to the optimum electric current or set the voltage of the electrostatic lens 106 to the optimum voltage. Accordingly, the focus height of the primary electron beam 102 can be caused to coincide with the height of the surface of the sample 107 with sufficient accuracy, and thus the spot diameter of the primary electron beam 102 on the sample surface can be minimum, to acquire an SEM image with a high resolution.

The control unit 126 further includes an image and data processing unit 127. The image and data processing unit 127 inspects, measures, observes, and analyzes a sample by processing data such as an acquired SEM image or a detection signal. Other processes for calculation or outputting by using an image signal or data can be performed. Though not illustrated, the control unit 126 includes an operation control unit that controls a series of operations such as inspection and measurement or the like.

The control unit 126 further includes an image acquisition point height information storage unit 121, a focus adjustment width storage unit 122, an image acquisition order storage unit 123, result accumulation database 124, and an operation required time estimation calculation unit 125. Hereinafter, functions of these components are described.

When the inspection and measurement is performed by using a semiconductor wafer or the like as the sample 107 by using the SEM, it is required to inspect and measure a plurality of image acquisition points in the wafer with high throughput. Therefore, usually, a series of operations (sequence) of storing information of the image acquisition points (inspection points) in the control unit 126 during the inspection, the measurement, or the like, sequentially moving the positions of the image acquisition points (hereinafter, referred to as fields of view) automatically or semi-automatically, and continuously acquiring images are performed.

As the information of the image acquisition points, the information of the plurality of image acquisition points on the surface of the sample 107 is stored in the image acquisition point height information storage unit 121. FIG. 2 illustrates the configuration example of the information (data) stored in the image acquisition point height information storage unit 121. As the information of the image acquisition points, identification numbers (inspection point numbers), position information (X, Y) on the sample, and height information (Z) of the sample surface at the positions are stored.

Here, the height information of the sample surface is described. At the plurality of image acquisition points of the sample 107, the height of the surface may change depending on the positions on the sample. Therefore, for observation with a high resolution, it is required to control the focus of electron beam according to the change of the height of the surface. Particularly, if the semiconductor wafer is used as a sample, it is required to observe a fine pattern with a high resolution in a circumstance in which the height of the surface of the sample on a large area wafer may greatly change, and thus the management of the height information of the surface of the sample and focus control according to the height become extremely important. As the factors changing the height of the surface according to the position on the sample such as the wafer, the warp of the wafer, the thickness distribution of the wafer itself, the thickness distribution of the formed film or the like on the wafer, the height distribution of the stage, the influence of particles on the stage, and the like are considered.

The position information (X, Y) of the image acquisition points of the sample 107 illustrated in FIG. 2 may be designated by an operator in order to perform desired inspection, measurement, or the like, or may be designated by inputting a result of another device. The height information (Z) may be designated by inputting a result of another device and may be determined as a value calculated based on the position information and the height distribution information of the sample surface acquired in advance. Here, as the height distribution information of the sample surface, a result of measurement when a height measuring instrument is mounted on the SEM and the sample is loaded may be used. When the warp or the thickness distribution of the sample is small, the height distribution information of the stage which is measured in advance may be used. Otherwise, the result obtained by adding the height distribution of the stage and the warp and the thickness distribution of the sample that is separately measured or estimated may be used.

Subsequently, the focus adjustment width that is the range of the height of the sample surface in which the focus can be adjusted during the focus adjustment by the electrostatic lens 106 is stored in the focus adjustment width storage unit 122. The focus adjustment width is the range of the height of the sample surface in which an image with a sufficiently high resolution or a result of inspection and measurement with high accuracy in the focus adjustment of the electrostatic lens 106 can be obtained, that is, the width of the range of the height of the sample surface in which a desired focus state (hereinafter, referred to as a focus adjustment width or h) can be obtained. In the range of the height of the sample that exceeds the focus adjustment width h, sufficient focus adjustment cannot be performed only with the electrostatic lens 106. The focus adjustment width can be determined according to the desired image resolution or the accuracy of the inspection, the measurement, and the like.

FIG. 3 illustrates an example of a configuration of information (data) that is stored in the focus adjustment width storage unit 122. It is likely that the focus adjustment width h changes according to the condition of the primary electron beam 102. Therefore, for example, if the focus adjustment width depends on the acceleration voltage of the primary electron beam 102, the value for each acceleration voltage may be stored as illustrated in FIG. 3. Otherwise, in case of depending on the other conditions, the value may be stored to include the information thereof or may be stored not as numerical value data as illustrated in FIG. 3 but as a calculation expression.

An order of acquiring an image, such as inspection, measurement, or the like of the plurality of image acquisition points on the sample surface is stored in the image acquisition order storage unit 123. FIG. 4 illustrates an example of a configuration of information (data) stored in the image acquisition order storage unit 123. The identification number (inspection point number) of the image acquisition points and the image acquisition order are stored. In the image acquisition order storage unit 123, a predetermined image acquisition order is stored in advance, and a new image acquisition order is prepared and stored. Based on the image acquisition order and the position information of the image acquisition points of FIG. 2, images of the image acquisition points of the surface of the sample 107 are acquired by the SEM, while the stage 108 is moved, so that an image acquisition sequence such as a series of inspection, measurement, observation, and the like is performed on one sample 107.

Information in the image acquisition sequence such as the inspection, measurement, or observation performed in the SEM is stored in the result accumulation database 124. FIG. 5 illustrates an example of the configuration of the information (data) stored in the result accumulation database 124. Examples of the information stored include image acquisition (inspection) date and time, an image acquisition (inspection) order, identification numbers (inspection point numbers) of the image acquisition points, position information of the image acquisition points that is stored in advance in the image acquisition point height information storage unit 121, measured values of the heights of the sample surface that are calculated from the result of the focus adjustment, the difference (height error) between the height information of the image acquisition points stored in advance and the height measured value, focus adjustment means (type) performed at each image acquisition point, and time required for inspection, measurement, observation, or the like at each image acquisition point. The information is sequentially stored for inspection, measurement, observation, or the like, and information is further added and stored appropriately whenever the image acquisition sequence such as inspection, measurement, or observation is performed a plurality of times.

The operation required time estimation calculation unit 125 estimates time required for a series of operations (sequence) such as inspection or measurement at the image acquisition points in an order stored in the image acquisition order storage unit 123. At least based on the height information of the image acquisition points, the focus adjustment width, and the image acquisition order, the time required for a series of operations when the image acquisition sequence such as inspection, measurement, or observation is performed is calculated. The operation required time estimation calculation unit 125 is described in Embodiment 4.

In Embodiment 1, as a focus adjustment unit, an electron microscope including the electrostatic lens 106 and the objective lens 105 is described. However, the embodiment is not limited thereto, and an electron microscope may have a stage focus function of adjusting a focus by an up and down of the stage 108. An example in which the electrostatic lens 106 is installed between the objective lens 105 and the sample 107 is described. However, the present embodiment is not limited to, and an electrostatic lens may be installed inside or on the objective lens 105, may be integrally configured with a magnetic pole configuring the objective lens 105 as an electrode of the electrostatic lens, or may be formed by applying a voltage to the sample 107.

In the above, the configuration of the SEM of Embodiment 1 is described. Hereinafter, a control method for inspecting or measuring the plurality of image acquisition points by using the SEM is described. Hereinafter, a case of performing inspection is described as a representative example of the inspection, measurement, observation, and the like for the purpose of acquiring an image. However, the measurement and observation can be performed in the same manner.

Figure 6:
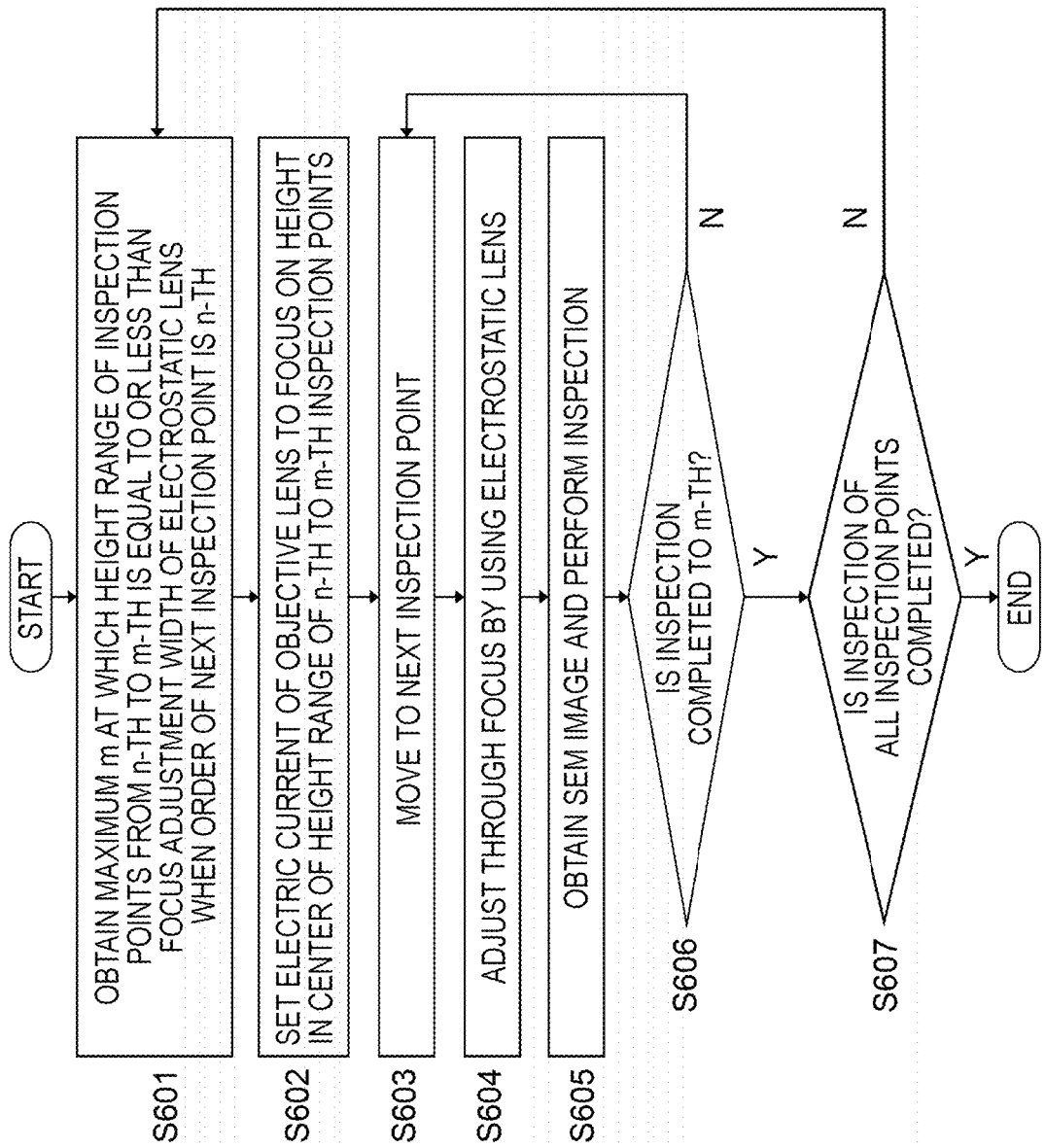
FIG. 6 is a flowchart of an inspection method according to Embodiment 1.
Figure 7:
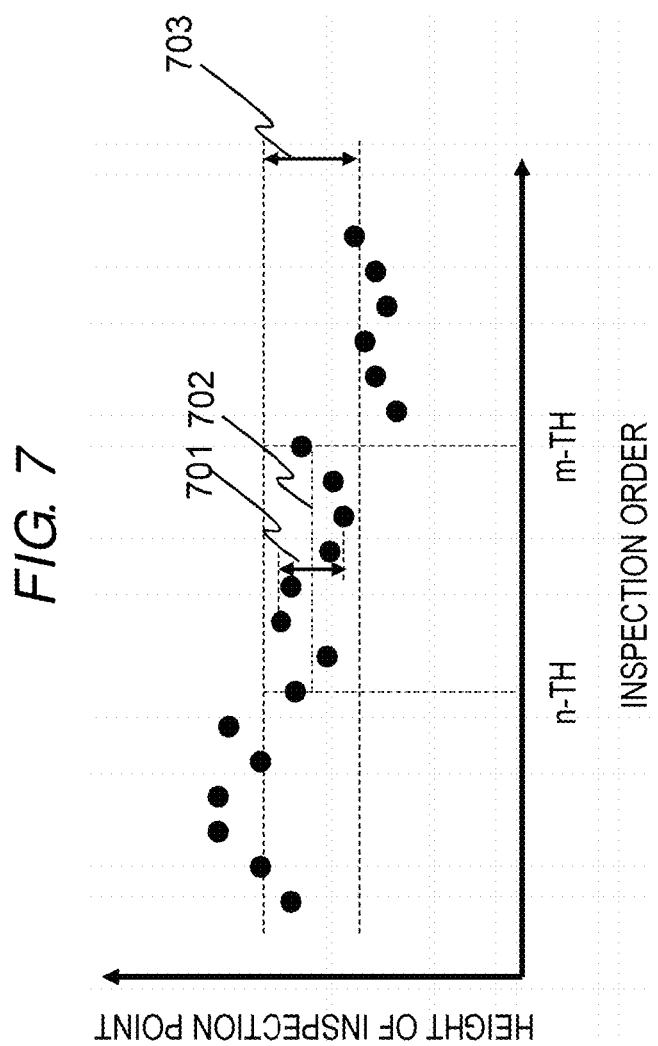
FIG. 7 is a schematic diagram illustrating a relation between the height of an image acquirement (inspection) point and an image acquirement (inspection) order according to Embodiment 1.

FIG. 6 illustrates an example of a flowchart in a method of inspecting a plurality of image acquisition (inspection) points on a sample surface according to Embodiment 1 using the SEM of FIG. 1. In FIG. 7, relations between heights of image acquisition (inspection) points in the inspection of Embodiment 1 and the image acquisition (inspection) order are schematically illustrated. In Embodiment 1, the image acquisition (inspection) is performed in an image acquisition order stored in the image acquisition order storage unit 123 in advance.

In Step S601 of FIG. 6, first, the image acquisition (inspection) order of the next image acquisition (inspection) point is set as the n-th. n is a natural number in the range from 1 to a total number of the inspection points. In case of an initial loop at the time of the inspection start, n=1. As illustrated in FIG. 7, with reference to the image acquisition (inspection) order stored in the image acquisition order storage unit 123 and the height information stored in the image acquisition (inspection) point height information storage unit 121, the maximum m in which a difference (range) 701 between the maximum value and the minimum value of the heights of the image acquisition (inspection) points continuously from the n-th to the m-th is equal to or less than a focus adjustment width 703 of the electrostatic lens 106 stored in the focus adjustment width storage unit 122 is obtained. m is a natural number in the range from n to a total number of inspection points. When the sample surface is charged, a value corrected by the next method as the height information to be used in steps subsequent to the present step can be used. A charging voltage at each point of the image acquisition (inspection) points is measured or estimated in advance and stored in the charging voltage storage unit (not illustrated), a focus shift amount by the charges is obtained by using a conversion coefficient between a charging voltage and a focus shift which is separately determined, and a focus shift amount by the charge is added to the height information at the image acquisition (inspection) point. Accordingly, the image acquisition (inspection) can be performed while also considering the influence of the charges.

In Step S602 of FIG. 6, the electric current of the objective lens 105 is set so that the primary electron beam 102 converges at the height in the center (the average between the maximum value and the minimum value) of the range of the heights of the image acquisition (inspection) points of the n-th to the m-th. As illustrated in FIG. 7, the electric current of the objective lens 105 is set so that the beam converges at a height 702 in the center of the range 701 of the heights of the inspection points of the n-th to the m-th. According to image acquisition (inspection) points of the n-th to the m-th, while the electric current condition of the objective lens 105 is caused to be constant, the focus height can be adjusted only by the adjustment of the electrostatic lens 106. Here, the focus height of the primary electron beam 102 is set as the height of the range center by the objective lens 105. However, the required condition is that the focus adjustment at the heights of the image acquisition (inspection) points of the n-th to the m-th can be performed only with the electrostatic lens 106 while the electric current condition of the objective lens 105 is caused to be constant. Therefore, as long as such condition is satisfied, the focus height of the objective lens 105 may not be necessarily in the center of the range. Herein, an example of changing the focus position by changing the electric current value of the objective lens 105 is described. However, as long as a state in which the relative position relation between the sample surface height and the focus height is the same can be realized, Step S602 may be performed by controlling not the current of the objective lens 105 but the height of the stage 108 or by using both.

In Step S603 of FIG. 6, by moving the stage 108, the field of view of the SEM is moved to the next inspection point, according to the inspection order stored in the image acquisition (inspection) order storage unit 123 and the position information of the inspection point stored in the image acquisition (inspection) point height information storage unit 121.

Steps S601 and/or S602, and Step S603 can be performed in parallel in order to improve throughput.

In Step S604, the through focus is adjusted by using the electrostatic lens 106. The through focus adjustment is to search an optimum voltage to be an optimum focus condition while changing the voltage of the electrostatic lens 106.

Figure 8:
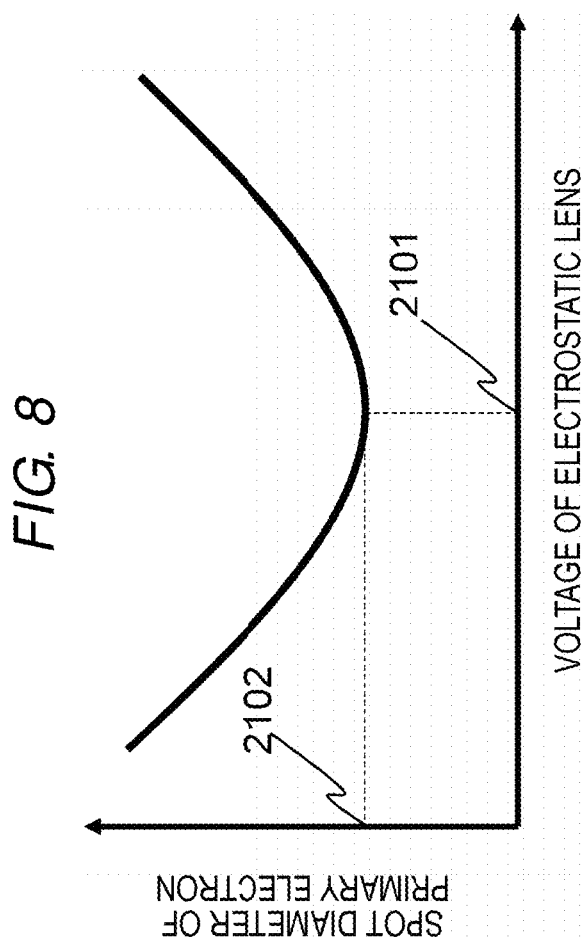
FIG. 8 is an explanatory diagram illustrating through focus adjustment according to Embodiment 1.
Figure 9:
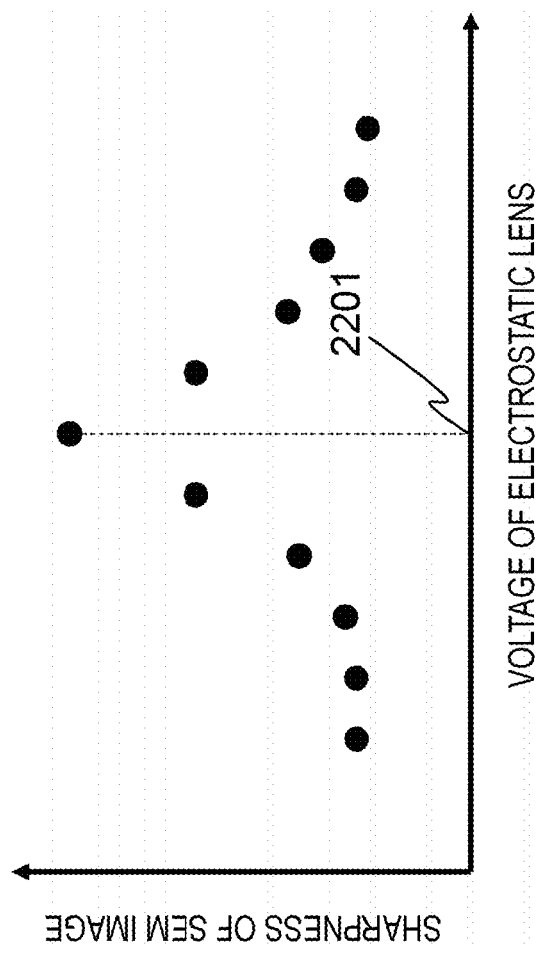
FIG. 9 is an explanatory diagram illustrating the through focus adjustment according to Embodiment 1.

FIGS. 8 and 9 illustrate explanatory diagrams of the through focus. If the voltage of the electrostatic lens 106 is changed, the height of the convergence point of the primary electron beam 102 is changed, so that the spot diameter of the primary electron beam 102 on the surface of the sample 107 is changed as illustrated in FIG. 8. If the voltage of the electrostatic lens 106 is set to an optimum voltage 2101 at which the spot diameter becomes a minimum value 2102, the focus height coincides with the sample surface and the state of the just focus can be obtained. Therefore, an SEM image with a high resolution can be obtained. In the actual operation, as illustrated in FIG. 9, while the voltage of the electrostatic lens 106 is changed, the SEM image is acquired, and the sharpness of each SEM image is evaluated. The voltage 2201 at which the SEM image is the sharpest is set as the optimum voltage, and the voltage of the electrostatic lens 106 is set to the optimum voltage, to adjust the focus. Since the voltage for acquiring the image is discrete, it is desirable to obtain the optimum voltage with higher accuracy by interpolation between data points by fitting.

At an inspection point in which an SEM image with a high resolution is not required, the focus is not adjusted by the through focus adjustment according to an actual focus state, but may be adjusted by obtaining the height to be adjusted by the electrostatic lens 106 by calculation from the difference between the height information stored in the image acquisition (inspection) point height information storage unit 121 and the focus height (for example, the center of the range of the heights of inspection points of the n-th to the m-th) of the primary electron beam 102 corresponding to the electric current of the objective lens 105 set in Step S602 and setting a corresponding voltage. Even when it is required to inspect an image with a high resolution, a flow of performing through focus adjustment by acquiring an image after the focus adjustment by a method not using the through focus adjustment and determining that the focus shift occurs only when the image is not sufficiently sharp may be set.

In Step S605, inspection is performed by acquiring an SEM image in the condition of the electrostatic lens 106 that is adjusted in Step S604.

In Step S606, it is determined whether the inspection to the m-th by Step S605 is completed, and if the inspection is not completed, the process returns to Step S603.

In Step S607, it is determined whether all inspection points are completed until Step S606, and if the inspection is not completed, the process returns to Step S601.

According to the above method, the loop from Step S603 to Step S606 repeats. During the loop repetition, that is, from the n-th inspection point to the m-th inspection point, the electric current of the objective lens 105 does not need to be changed. Accordingly, the number of times of changing the electric current of the objective lens 105 until the inspection of all the inspection points are completed can be reduced to a minimum. Therefore, the throughput of the inspection (image acquisition) sequence can be improved by reducing the number of times of the electromagnetic focus adjustment with lower speed than the electrostatic focus adjustment.

Embodiment 2

Another method of inspecting the plurality of points on the sample surface by using the SEM of FIG. 1 is performed as Embodiment 2. In Embodiment 1, with respect to the inspection order of the plurality of inspection points, inspection is performed by using the inspection order stored in advance without change. However, in Embodiment 2, the inspection order is updated to an appropriate order by using the height information of the inspection points and the focus adjustment width of the electrostatic lens. Hereinafter, in Embodiment 2, portions different from Embodiment 1 are described, and portions common to Embodiment 1 are not described. The same names and reference numerals (numbers) are used for the device configurations common to Embodiment 1.

Figure 10:
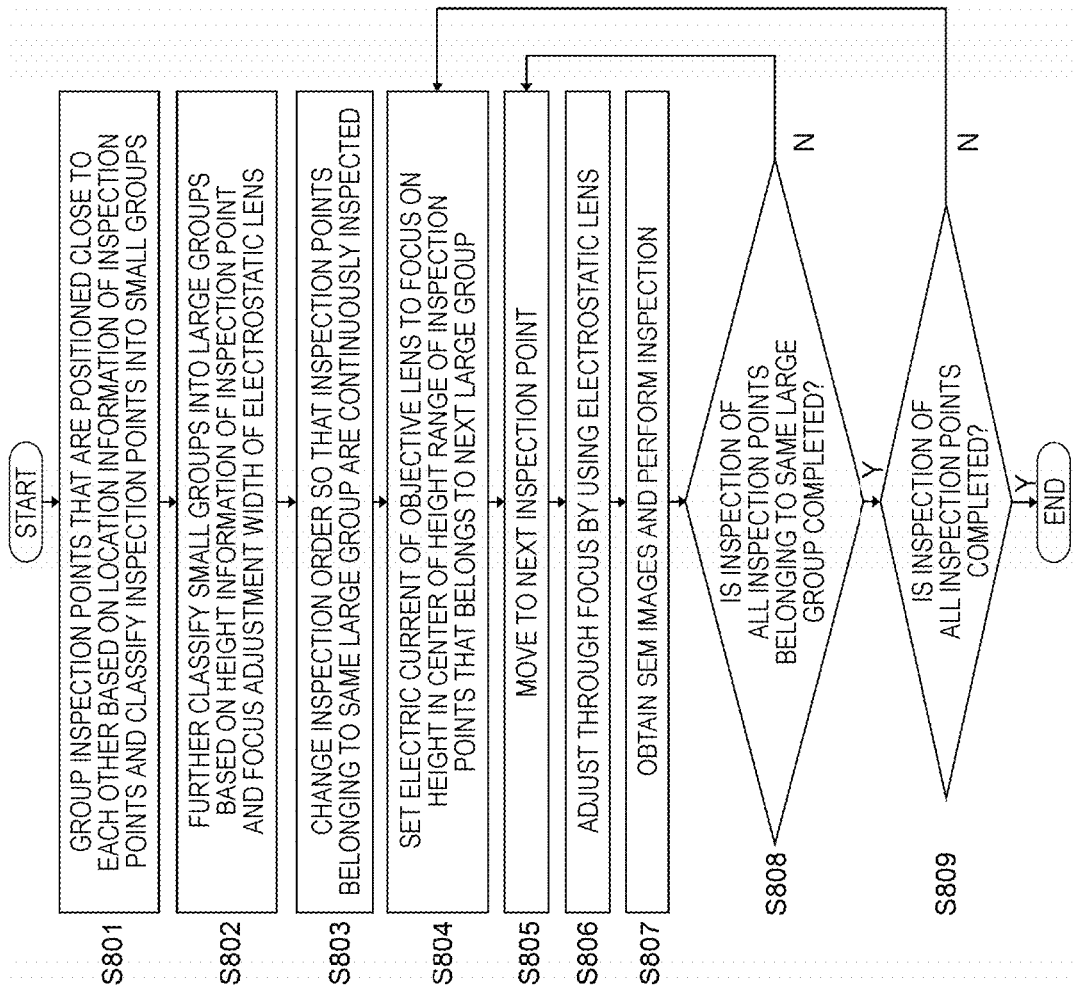
FIG. 10 is a flowchart illustrating an inspection method according to Embodiment 2.
Figure 11:
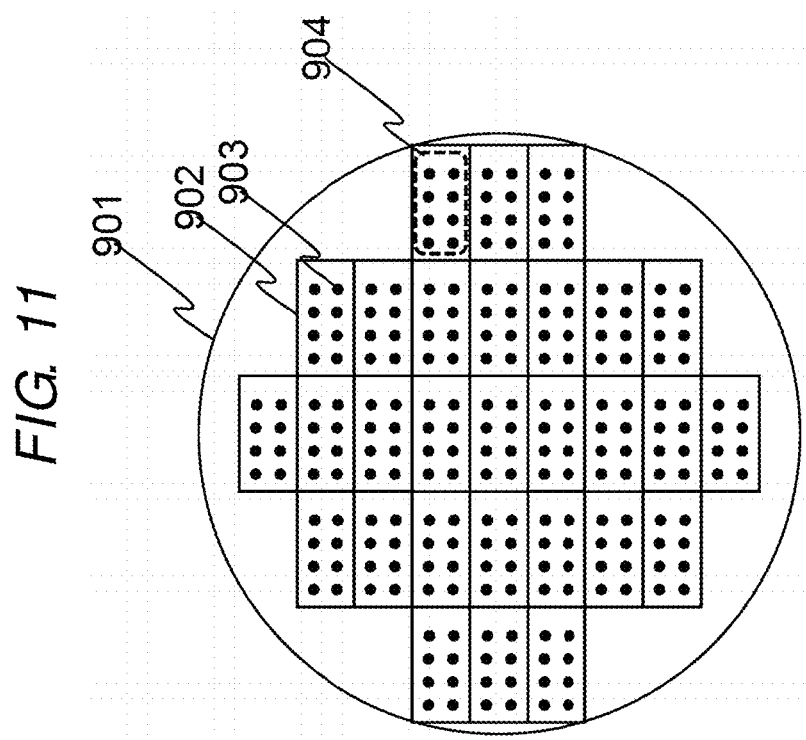
FIG. 11 is an explanatory diagram illustrating a method of classifying a small group according to Embodiment 2.

FIG. 10 illustrates a flowchart of Embodiment 2. First, in Step S801, based on the position information (X, Y) of the inspection points stored in the image acquisition (inspection) point height information storage unit 121, image acquisition (inspection) points positioned close to each other are grouped and classified into a plurality of small groups. FIG. 11 illustrates an example of a specific method of classification to the small groups. When the sample 107 is a wafer of a semiconductor device, usually, a pattern layout in a wafer 901 is a repetition of chips 902 with the same pattern layout, and image acquisition (inspection) points 903 are the same in each chip. Accordingly, a method of grouping the inspection points 903 in the same chip to be divided into the same small group 904 is simple. The embodiment is not limited thereto. A plurality of adjacent chips are set as one unit, and inspection points in the unit may be grouped into a small group. Otherwise, an area obtained by further dividing the chips may be set as one unit. Otherwise, regardless of the chips, the sample may be grouped in square mesh shapes at a predetermined distance and divided into small groups. Such grouping is a step of simplifying the processes in Step S803 described below, if a total number of inspection points is large. If a total number of inspection points is small, all the inspection points are classified into other small groups, and thus such grouping may be omitted in practice.

Figure 12:
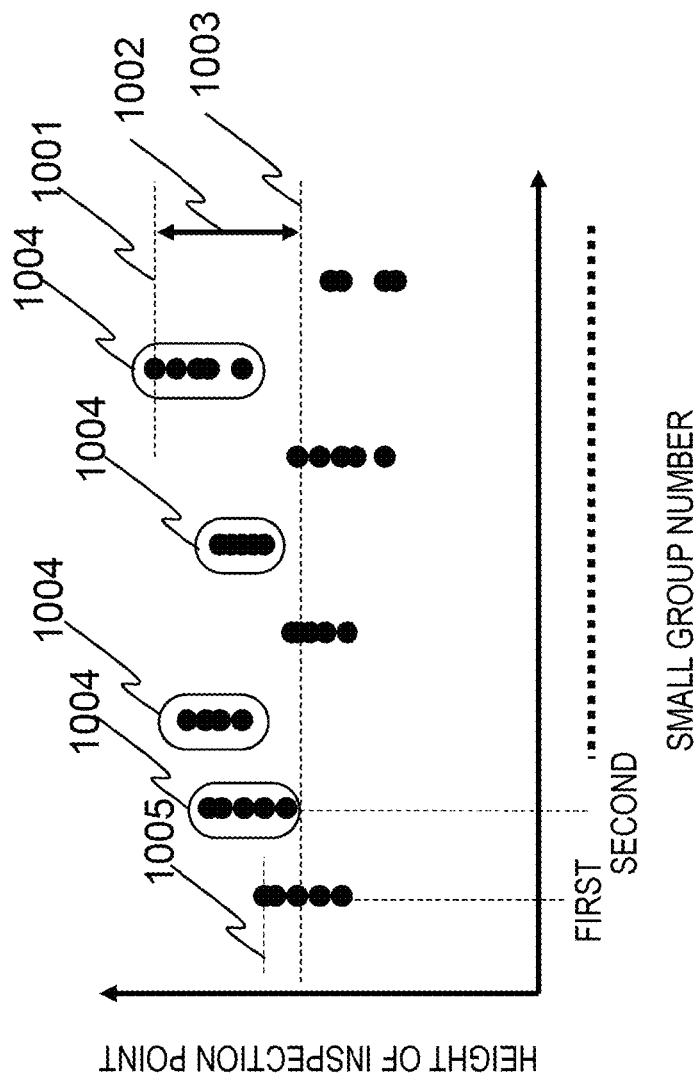
FIG. 12 is an explanatory diagram illustrating a method of classifying a large group according to Embodiment 2.
Figure 13:
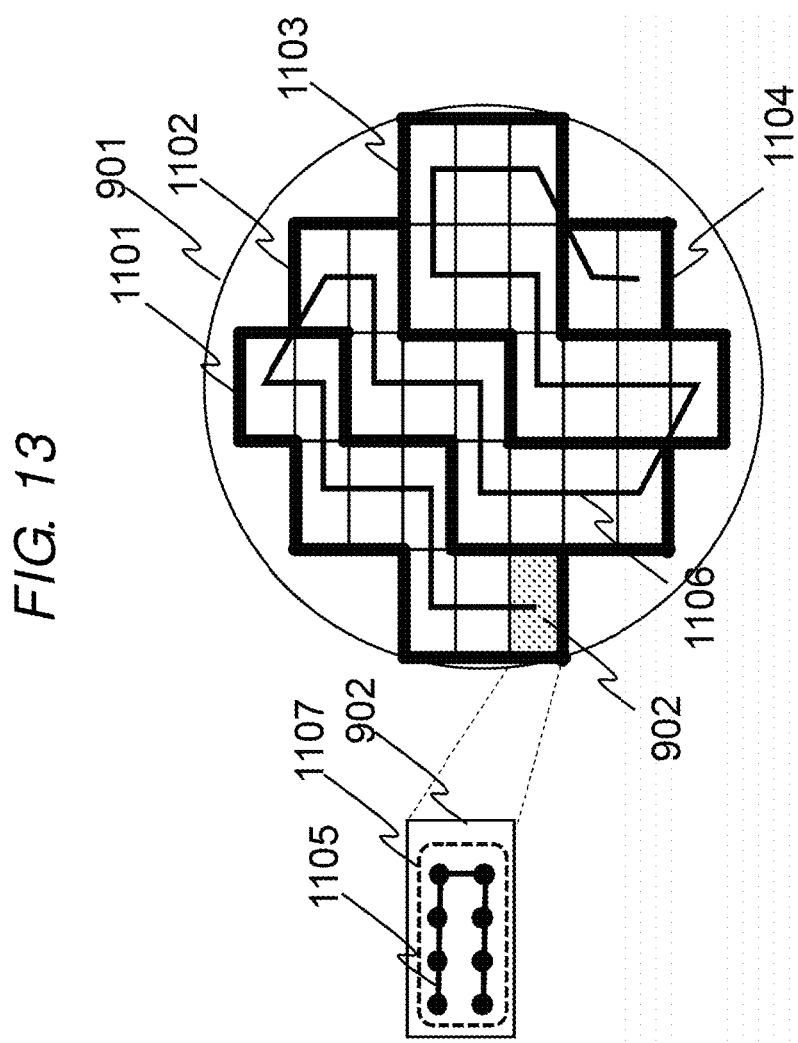
FIG. 13 is an explanatory diagram of a classification result and an inspection order of the large group according to Embodiment 2.

In Step S802, based on the height information of the inspection points stored in the image acquisition (inspection) point height information storage unit 121 and the focus adjustment width of the electrostatic lens 106 stored in the focus adjustment width storage unit 122, the small groups classified in Step S801 may be further grouped to be classified into large groups. FIG. 12 illustrates an example of a specific method of classification into large groups. Such grouping is to divide the small groups so that the range (the difference between the maximum value and the minimum value) of the heights of the inspection points in the same group becomes smaller than the focus adjustment width of the electrostatic lens 106. First, the maximum value of the heights of all the inspection points is obtained as a maximum value 1001 of the heights for the first large group, and a threshold value obtained by subtracting a focus adjustment width 1002 of the electrostatic lens from the maximum value is obtained as a first large group height minimum value 1003. Small groups in which the heights of all the inspection points belonging to each small group are higher than the threshold value (the first large group height minimum value 1003) are selected, and the inspection points belonging to the small groups are grouped as image acquisition (inspection) points 1004 belonging to the first large group and are set as a first large group. Subsequently, with respect to all the inspection points except for the first large group, the maximum value of the heights is obtained as a second large group height maximum value 1005 in the same manner, the same method is applied in the following, and inspection points belonging to a second large group are selected. The method is repeated so that all inspection points are classified to belong to any large group. FIG. 13 illustrates an example of a result of the classification. Inspection points in the same chip 902 in the semiconductor wafer 901 are classified into a small group 1107, and all the small groups in the wafer are classified into four large groups 1101 to 1104 illustrated with bold lines.

In Step S803, an inspection order stored in the image acquisition (inspection) order storage unit 123 is changed so that the inspection points belonging to the same large group are continuously inspected. Here, in order to increase the throughput of the inspection sequence, it is more desirable as the time for the stage movement for moving the fields of view between the plurality of inspection points is shorter. Therefore, the inspection order of the inspection points in the same large group is more desirable as the length of a movement path is shorter. In general, the number of inspection points in the same large group is large, and thus it is difficult to optimize the path for practical time. Therefore, it is desirable to use a method of two steps. First, by continuously inspecting inspection points in the same small group, the inspection order in the small group is determined so that the movement path between the inspection points becomes the shortest. The inspection order between the small groups is determined so that the movement path between the small groups becomes the shortest. With respect to an order between different large groups, in the same manner, to shorten the time for stage movement, it is desirable that adjacent large groups are continuously inspected. FIG. 13 illustrates an example of a movement path of the inspection order determined accordingly. In the semiconductor wafer 901, the chip 902 is set as one small group 1107, an order in the chip 902 is set as a shortest path 1105, an order between chips is set as the shortest path inside the large group 1101 or the like to continuously perform inspection, and an order between the adjacent large groups is set as a path 1106 in which the large groups 1101, 1102, 1103, and 1104 are sequentially inspected in an adjacent order.

In Step S803, it is described that the inspection order is changed, but the inspection order before the change is set as a first inspection order, and the inspection order after the change is set as a second inspection order, so that both can be stored in the image acquisition (inspection) order storage unit 123, and arbitrarily selected.

In Step S804 and following steps, the inspection starts in the inspection order determined in Step S801 to S803.

In Step S804, the electric current of the objective lens 105 is set so that the primary electron beam 102 converges at the height in the center (the average of the maximum value and the minimum value) of the range of the heights of the inspection points belonging to the next large group (the first large group when the inspection starts). Accordingly, with respect to the inspection points belonging to the same large group, while the electric current condition of the objective lens 105 is set to be constant, the focus height can be adjusted only by the adjustment of the electrostatic lens 106. Here, in the same manner as in Step S602, the focus height of the primary electron beam 102 is set to the height in the center of the range. However, as long as the heights of the inspection points in the same large group can be focus-adjusted only by the electrostatic lens 106 while the electric current condition of the objective lens 105 is caused to be constant in the condition, the condition of the focus height by the objective lens 105 may not necessarily be the center of the range.

In Step S805, in the same manner as in Step S603, the stage is moved to move the field of view of the SEM to the next inspection point according to the inspection order newly stored in the image acquisition (inspection) order storage unit 123 and the position information stored in the image acquisition (inspection) point height information storage unit 121.

Steps S804 and S805 can be performed in parallel in order to improve the throughput.

In Step S806, in the same manner as in Step S604, the through focus adjustment is performed by using the electrostatic lens.

In Step S807, in the same manner as in Step S605, an SEM image is acquired, and inspection is performed.

In Step S808, it is determined whether the inspection of all inspection points belonging to the same large group is completed until Step S807, and if the inspection is not completed, the process returns to Step S805.

In Step S809, it is determined whether the inspection of all inspection points is completed until Step S808, and if the inspection is not completed, the process returns to Step S804.

Accordingly, it is not required to change the electric current of the objective lens 105 in the same large group, the number of times of changing the electric current of the objective lens 105 until the inspection of all the inspection points is completed can be reduced to a minimum, and the movement path between the inspection points is optimized. Therefore, the time required to move the stage can be shortened, and the throughput of the inspection can be improved.

Figure 14:
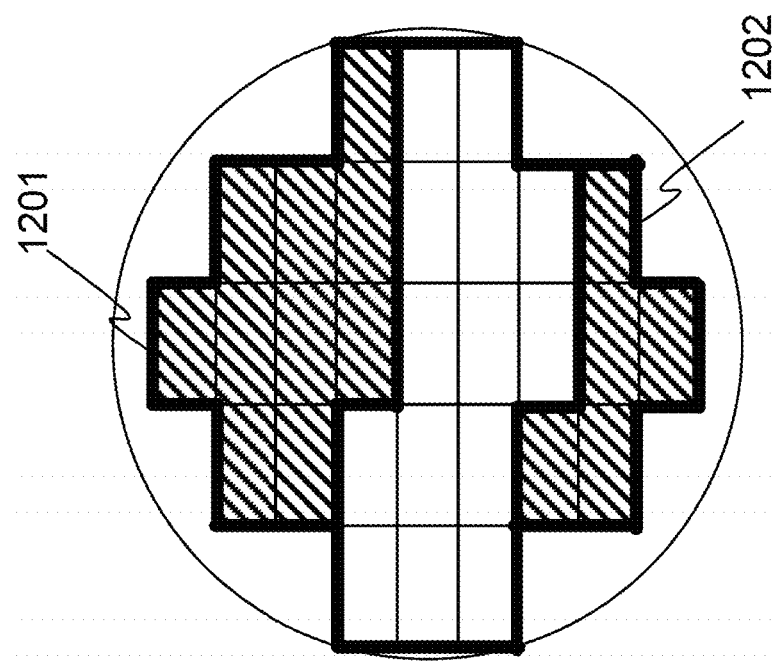
FIG. 14 is a diagram illustrating another example of the large group according to Embodiment 2.

In the large group determined in Step S802, as illustrated in the example of FIG. 14, if an area 1201 and an area 1202 which are positioned to be separated from each other belong to the same large group, the time required to adjust the electric current of the object lens and the time required to move the stage between the areas are compared with each other. If the latter is longer, the large group is divided into two large groups, and the throughput can be further improved by causing the area positioned to be separated to be in another large group.

Embodiment 3

As Embodiment 3, in the method described in Embodiment 1 or 2 using the SEM of FIG. 1, a method of reducing failures of focus adjustment described below is performed. Hereinafter, in Embodiment 3, portions different from Embodiments 1 and 2 are described, and the common portions are not described. The same names and reference numerals (numbers) are used for the device configurations common to Embodiments 1 and 2.

First, the failure of the focus adjustment is described. The failure of the focus adjustment refers to a case where the height of the actual sample 107 is not included in the range of the focus adjustment width when the focus of the electrostatic lens 106 is adjusted, the primary electron beam 102 is not focused on the voltage change of the electrostatic lens 106 in the range corresponding to the focus adjustment width, and the spot diameter cannot be sufficiently reduced. For example, as described in Embodiment 2, all the inspection points included in the same large group have the heights that can be focus-adjusted by the electrostatic lens 106. However, if there is an error in the height information of the inspection points stored in the image acquisition (inspection) point height information storage unit 121, it is likely that the heights of the actual inspection points exceed the focus adjustment range of the electrostatic lens 106. If the focus adjustment fails, the primary electron beam 102 is not sufficiently focused, there is an influence in which the resolution of the image decreases, and thus the inspection accuracy decreases.

In Embodiment 3, in order to reduce such failures, a margin $\Delta h$ to the focus adjustment width h is introduced, and a value (h−$\Delta h$) obtained by subtracting the margin $\Delta h$ from the width h in which the focus can be actually adjusted is used instead of the focus adjustment width h (703 of FIG. 7, and 1002 of FIG. 12) in Step S601 of Embodiment 1 and Step S802 of Embodiment 2. Accordingly, when the inspection points in the range of the focus adjustment width are searched, the inspection points are searched to be limited to a narrower focus adjustment width, and the likeliness of the failure in the focus adjustment in the actual inspection sequence can be reduced.

Hereinafter, the determination of the margin $\Delta h$ of the focus adjustment width is described.

In the result accumulation database 124 illustrated in FIG. 1, as exemplified in FIG. 5, when the inspection points are inspected, with respect to the inspection points, all information of the inspection such as the position information (X, Y) stored in the image acquisition (inspection) point height information storage unit 121, height information ($Z_0$) (not illustrated), height measured value ($Z_1$), difference (a height error ($\Delta Z = Z_1 - Z_0$)) between the stored height information $Z_0$ and the height measured value $Z_1$, performed focus adjustment means (type), and time required for the inspection is stored and accumulated. When the inspection sequence is performed a plurality of times, all the information of the inspection for each time is accumulated. In Embodiment 3, in order to differentiate the height information stored in advance and the measured value of the height, the former is denoted by $Z_0$, and the latter is denoted by $Z_1$. The result accumulation database 124 may be independently operated for each SEM and may be shared in a plurality of SEMs.

Here, the height measured value $Z_1$ is a measured value of the height of the actual sample surface at each inspection point. The height measured value can be calculated from the setting electric current of the objective lens 105 and the setting voltage of the electrostatic lens 106 when the performance of S604 is completed, by using a calibration curve determined in advance. Originally, the height information $Z_0$ of the inspection point stored in the image acquisition (inspection) point height information storage unit 121 needs to be the same as the height measured value $Z_1$. However, the height information $Z_0$ is obtained by calculation based on the position information (X, Y) of the inspection point and the height distribution information of the sample surface as described above or is obtained by inputting a result of the other device. Therefore, a shift from the actual height measured value $Z_1$ may occur. The shift becomes the height error $\Delta Z$ described above.

The margin $\Delta h$ of the focus adjustment value may be determined from the data of the result accumulation database 124. The failure of the focus adjustment occurs since the height of the inspection point exceeds the focus adjustment width h, due to a difference (height error) $\Delta Z$ between the height information $Z_0$ stored with respect to the inspection points as described above and the actual height (measured value) $Z_1$. Therefore, the margin $\Delta h$ of the focus adjustment width h in order to solve such problems may be set to an amount of the height error $\Delta Z$ accumulated in the result accumulation database 124. Specifically, a statistical index representing the variation in the height error $\Delta Z$ may be used as the margin $\Delta h$. For example, a maximum value of an absolute value of the variation of the height error $\Delta Z$, a difference between the maximum value and the minimum value, and three times of standard deviation, and the like are appropriate.

The amount of the margin $\Delta h$ obtained accordingly is stored together with the focus adjustment width h in the focus adjustment width storage unit 122, the amount is referred to during the inspection to read the focus adjustment width as (h−$\Delta h$), and then the adjustment and the control may be performed. For the focus adjustment width, h is stored as $h_1$, and (h−$\Delta h$) is stored as $h_2$. During the inspection, $h_1$ or $h_2$ can be arbitrarily selected and used.

From the relation between the position information (X, Y) and the height measured value $Z_1$ accumulated in the result accumulation database 124, a so-called learning function that updates the height information $Z_0$ itself of the inspection point stored in the image acquisition (inspection) point height information storage unit 121 to the information with higher accuracy can be provided. Accordingly, the failure of the focus adjustment can be avoided without changing the focus adjustment width h or subtracting the margin $\Delta h$.

Embodiment 4

As Embodiment 4, an inspection method of estimating time for inspecting the plurality of inspection points on the sample surface by using a calculation unit that estimates inspection time before the inspection of Embodiments 1 to 3 using the SEM of FIG. 1 is performed. Hereinafter, portions different from Embodiments 1 to 3 are described for Embodiment 4. The portions common to Embodiments 1 to 3 are not described.

In Embodiment 4, the operation required time (inspection time) required for the inspection sequence (operation) is estimated and calculated by using the operation required time (inspection time) estimation calculation unit 125 illustrated in FIG. 1. The time required for the inspection sequence can be obtained as the sum of the time for the focus adjustment performed at each inspection point, the time for the movement of a field of view (stage movement) between inspection points, the time for the image acquisition of the SEM at each inspection point, the time for the data process required for the inspection (inspection time), and the like.

The focus adjustment time and the stage movement time are calculated as below. Based on the position information (X, Y) and the height information (Z) of the inspection points which are stored in the image acquisition point height information storage unit 121 and the inspection order stored in the image acquisition (inspection) order storage unit 123, the change amount of the heights between two continuous inspection points, performed focus adjustment means (type), the time required for the focus adjustment, and position change amount, that is, the amount of the movement of the field of view (stage movement) are obtained.

With respect to the focus adjustment means, for example, Step S601 of Embodiment 1 is performed, an inspection flow from S602 to S605 is not performed, and the determination of S606 and S607 is virtually performed, so that whether to perform the electrostatic lens adjustment only or to also perform the objective lens adjustment can be determined. Otherwise, Steps S801 to S803 of Embodiment 2 are performed, the inspection flow of S804 to S807 is not performed, and the determination of S808 and S809 is virtually performed, so that whether to perform the electrostatic lens adjustment only or to also perform the objective lens adjustment can be determined. Otherwise, if a result obtained by performing the same kind of inspection is accumulated in the result accumulation database 124, the determination can be performed with reference to the focus adjustment means which is accumulated in the result accumulation database 124 and performed at each inspection point.

Figure 15:
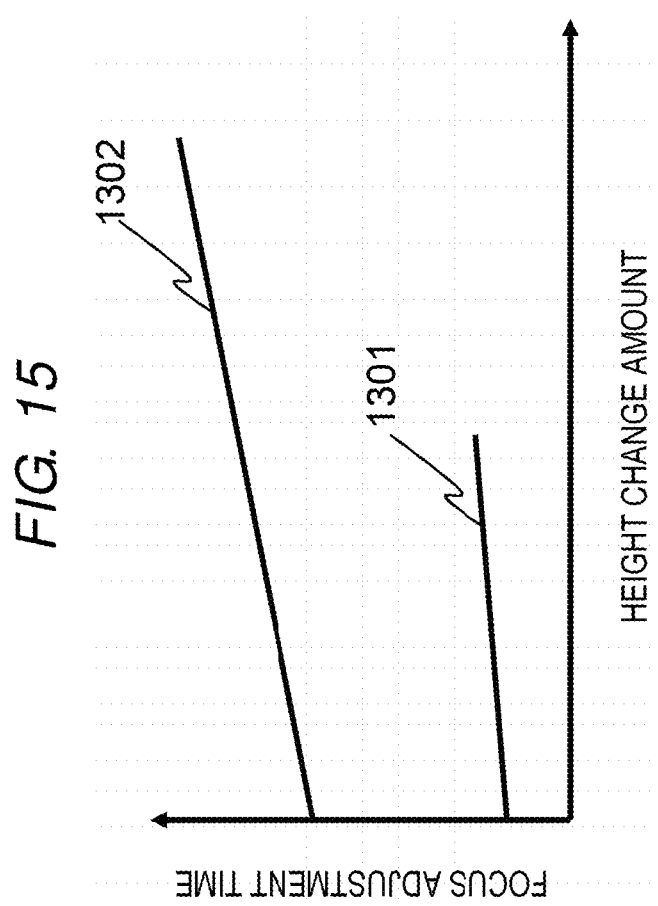
FIG. 15 is a diagram illustrating a calibration curve of a height change amount and a focus adjustment time according to Embodiment 4.

Subsequently, the focus adjustment time at each inspection point is calculated. The focus adjustment time is obtained from the height change amount between the two continuous inspection points and the information of the performed focus adjustment means by using the calibration curve indicating the relation between the height change amounts determined in advance respectively for the electrostatic lens and the objective lens illustrated in FIG. 15 and focus adjustment time (1301 and 1302).

Figure 16:
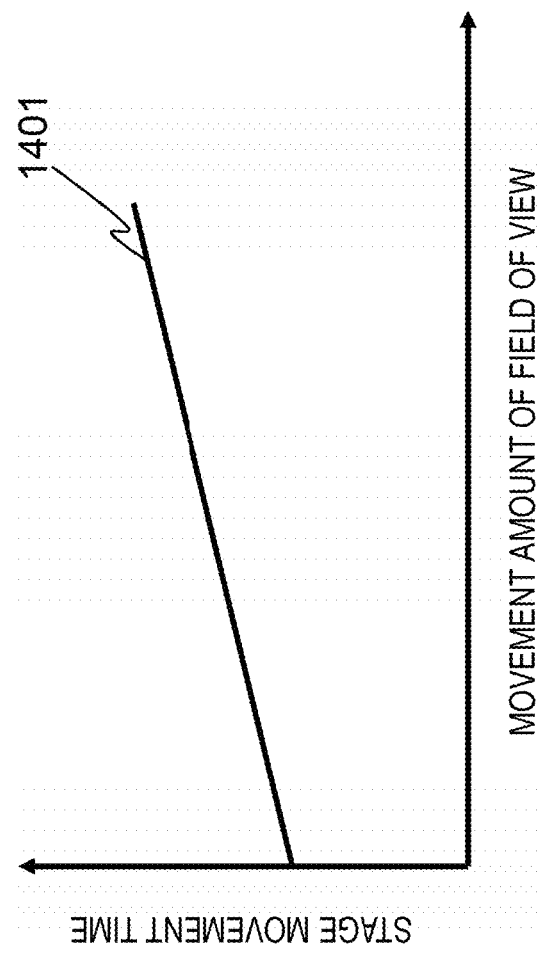
FIG. 16 is a diagram illustrating a calibration curve of a field-of-view movement amount and stage movement time according to Embodiment 4.

Thereafter, the stage movement time between inspection points is calculated. The stage movement time is obtained from the movement amount of the field of view, which is described above by using the calibration curve indicating the relation between the movement amount of the field of view and stage movement time (1401) determined in advance as illustrated in FIG. 16.

The time required for the inspection including the movement of each inspection point and the adjustment can be calculated by adding time for acquiring an SEM image that is separately determined and the inspection time such as the image and data process required for the inspection to the focus adjustment time and the stage movement time. The results are calculated with respect to all inspection points to obtain the sum, so that the required time required for the inspection sequence (operation) of one sample can be estimated.

Otherwise, if the result obtained by performing the same kind of inspection is accumulated in the result accumulation database 124, the inspection time can be estimated with reference to the time that is accumulated in the result accumulation database 124 and required for the inspection of each inspection point.

As described above, the operation required time of the inspection sequence is estimated in advance, and the inspection described in Embodiments 1 to 3 is performed. Accordingly, before the inspection, the inspection time or the throughput shortening effect of Embodiments 1 to 3 can be quantitatively understood.

Embodiment 5

As Embodiment 5, a method that enables an SEM operator to select various kinds of conditions in the inspection of Embodiments 1 to 4 when Embodiments 1 to 4 are performed by using the SEM of FIG. 1 is performed. Hereinafter, the portions different from Embodiments 1 to 4 are described as Embodiment 5.

In Embodiment 5, the SEM includes a display device, and has a function of enabling input and output from and to the operator of the SEM, such as a graphic user interface (GUI). The display device may be integrated with or independent from the output device 118 of FIG. 1.

Figure 17:
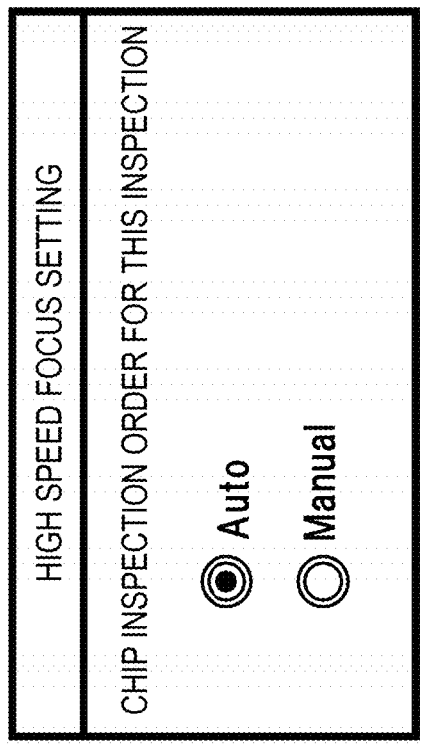
FIG. 17 is a diagram illustrating a display content of a GUI according to Embodiment 5.
Figure 18:
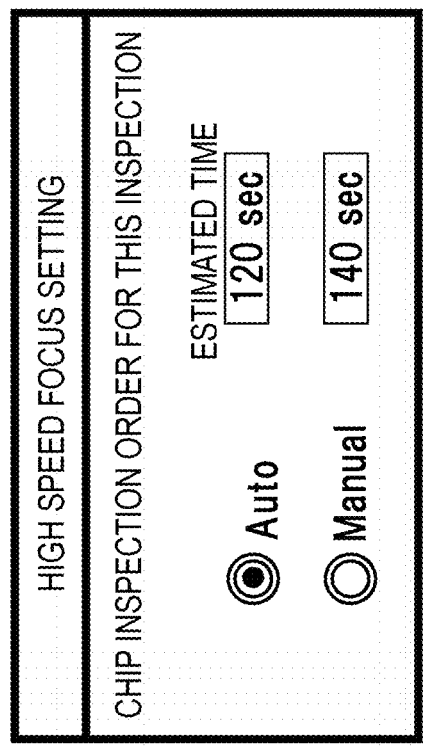
FIG. 18 is a diagram illustrating the display content of the GUI according to Embodiment 5.
Figure 19:
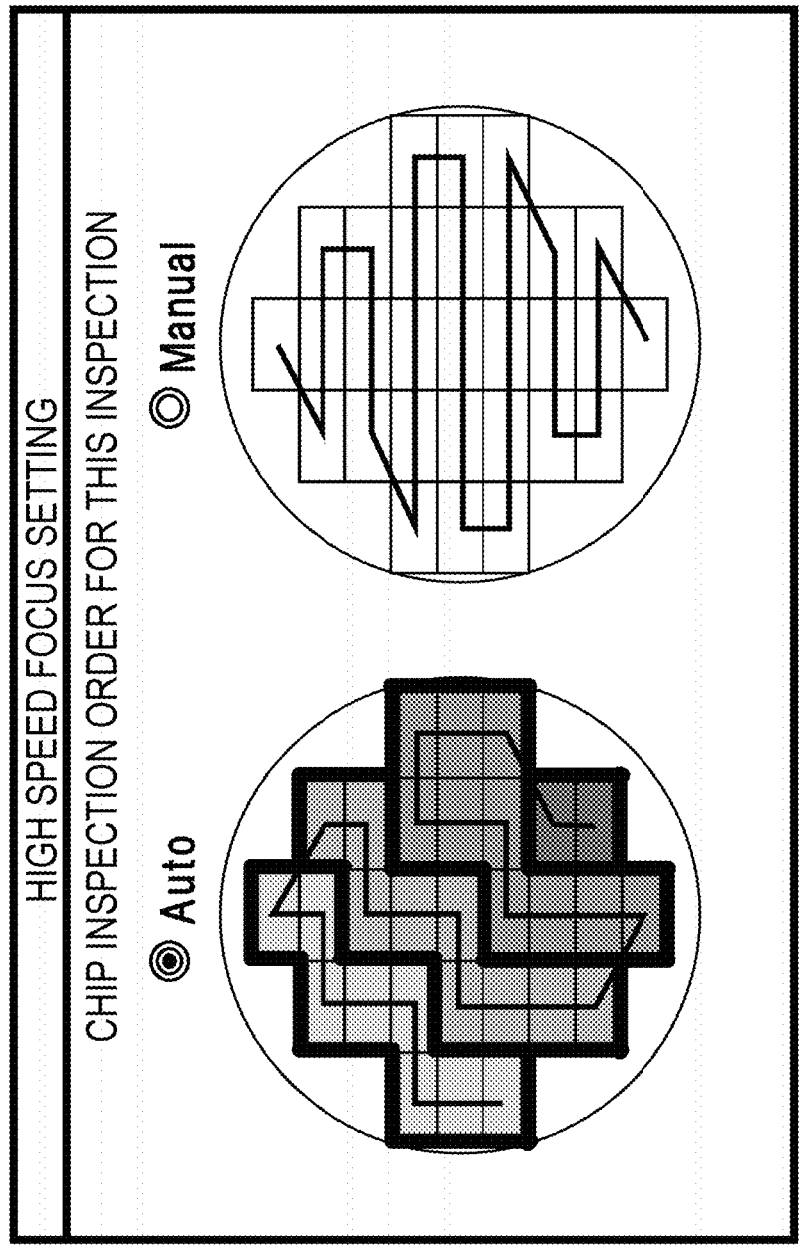
FIG. 19 is a diagram illustrating the display content of the GUI according to Embodiment 5.

FIG. 17 illustrates an example of a GUI screen that causes whether to change an inspection order of inspection points to be selected. A display as illustrated in FIG. 17 is output to cause the operator to select Auto or Manual. When Auto is selected, the inspection order is changed by the method described in Embodiment 2. When Manual is selected, by the method described in Embodiment 1, the inspection order stored in advance is not changed, and the inspection is performed. According to such method, when the change of the inspection order is somehow not desirable, it is possible to not to change the inspection order. Otherwise, as illustrated in FIG. 18, estimated time required for the inspection that is calculated by using the method described in Embodiment 4 is also displayed respectively for a case of changing an inspection order and a case of not changing an inspection order, so that the operator can perform selection in consideration of the inspection estimated time. Otherwise, as illustrated in FIG. 19, movement paths when the inspection order is changed and is not changed, and grouping results, height distribution in the sample (for example, the average value of height at inspection points in a chip is displayed with a color map) may be displayed together. Accordingly, the validity of the grouping or the movement path can be confirmed, and thus it is possible to promote appropriate determination by the operator.

Figure 20:
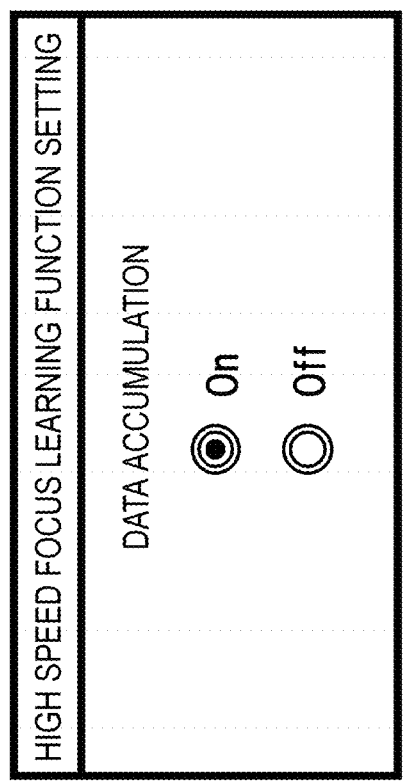
FIG. 20 is a diagram illustrating the display content of the GUI according to Embodiment 5.

Otherwise, as illustrated in FIG. 20, a display for selecting whether a learning function is to be used may be output to the display device, so that the operator can be selected whether to cause the learning function described in Embodiment 3 to be performed. Though not illustrated, various other conditions for the inspection such as whether to consider the margin Δh described in Embodiment 3 can be selected.

Figure 21:
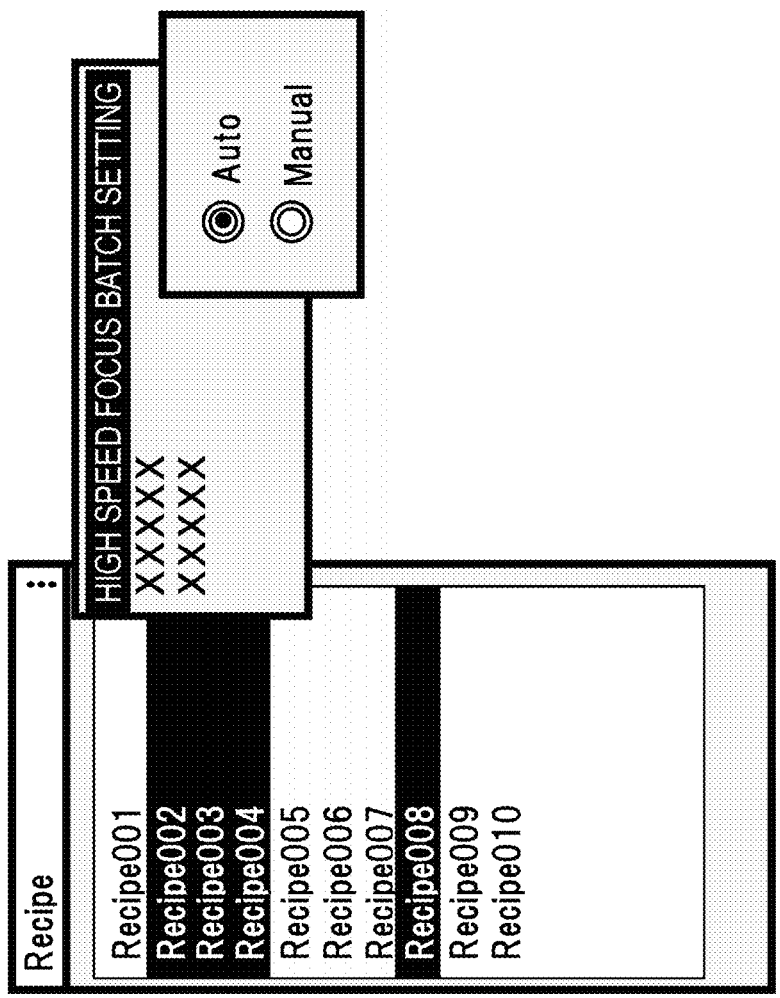
FIG. 21 is a diagram illustrating the display content of the GUI according to Embodiment 5.

With respect to selection described above, when a recipe in which the inspection points are stored for each type of the sample is stored in the SEM, the selection may be performed for each recipe, or may be collectively set by causing the operator to select a plurality of recipes by outputting the display as illustrated in FIG. 21.

Embodiment 6

As Embodiment 6, another method of inspecting a plurality of inspection points on the sample surface by using the SEM of FIG. 1 is performed. Embodiment 6 provides a plurality of focus adjustment widths to perform control in the inspection methods of Embodiments 1 to 5. Differences of Embodiment 6 from Embodiments 1 to 5 are described below. The portions common to Embodiments 1 to 5 are not described.

Embodiment 6 stores two or more types of the focus adjustment widths h in the inspection methods of Embodiments 1 to 5. The necessity of such function is first described.

In Step S604 of Embodiment 1 (FIG. 6) or Step S806 of Embodiment 2 (FIG. 10), in order to perform the through focus adjustment by using the electrostatic lens 106, the voltage of the electrostatic lens as illustrated in FIG. 9 is changed in the voltage range corresponding to the focus adjustment width to acquire an SEM image, and an optimum voltage in which an image becomes the sharpest among the acquired SEM images is searched.

Figure 22:
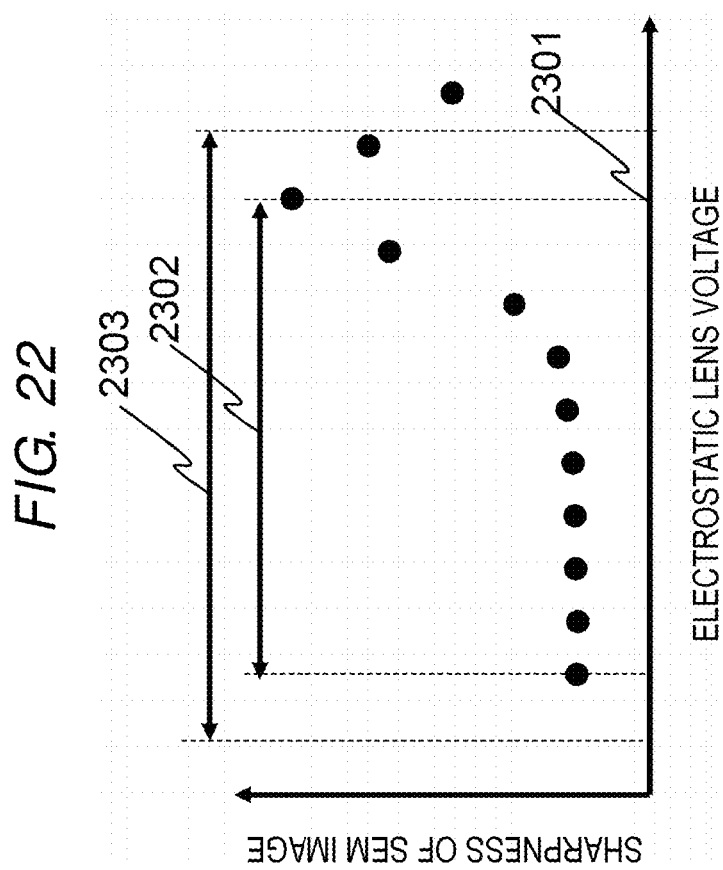
FIG. 22 is an explanatory diagram illustrating the through focus adjustment according to Embodiment 6.

However, for example, as illustrated in FIG. 22, when an optimum voltage 2301 searched in the range of a voltage width 2302 of the electrostatic lens corresponding the focus adjustment width is positioned at the upper limit of the voltage width 2302 of the electrostatic lens, a higher voltage side cannot be searched, and thus whether the sharpness in the voltage 2301 is the maximum cannot be determined, and the optimum voltage cannot be determined. The same is applied when the lower limit of the voltage width is the optimum voltage. As such, in a strict sense, with respect to the focus adjustment width h, the entire area cannot be utilized for inspection. As illustrated in FIG. 3, such a problem occurs when only a single value is set for the focus adjustment width h in a condition such as the acceleration condition.

In contrast, as illustrated in FIG. 23, such problem can be solved by storing the focus adjustment width h of the electrostatic lens in the focus adjustment width storage unit 122 in a format of including a plurality of values depending on the application. That is, in addition to the focus adjustment width h, a through focus allowable width h' which has a wider range than h is stored.

Hereinafter, the focus adjustment width h and the through focus allowable width h' are described. While the focus adjustment width h of the electrostatic lens is defined by a range or the like in which the accuracy of the inspection is not deteriorated, for example, due to the influence on the primary electron beam or the signal electron. The through focus allowable width h' may be a width which is wider and in which the focus change can be set during the through focus or, for example, may be a focus change width that is limited by a dynamic range of the power supply of the electrostatic lens. Otherwise, through focus allowable width h' may be defined as a case in which a shift of the field of view caused by the focus change does not influence on the evaluation of the sharpness of the SEM image during the through focus operation illustrated in FIG. 9 or 22, and the determination of the optimum voltage is not hindered or a range in which the acquisition itself of the SEM image does not become difficult due to the influence on the signal electron.

As such, independently from the focus adjustment width h in which the inspection can be performed, if the through focus allowable width h' (here, h<h') that determines a setting width of the height change range when the through focus is performed is stored in the focus adjustment width storage unit 122, in FIG. 22, an optimum voltage can be searched by setting a voltage setting range of the through focus of the electrostatic lens not to the focus adjustment width h but to an expanded voltage width 2303 corresponding to the through focus allowable width h' and changing the voltage in the expanded voltage width 2303 always corresponding to h' when the through focus is performed. Therefore, the above problem is solved. In another method, the through focus is usually performed in the voltage width 2302 of the electrostatic lens corresponding to the focus adjustment width h, and the voltage is changed to be expanded to the expanded voltage width 2303 corresponding to the range of h' wider than h only when the voltage becomes optimum in the upper limit or the lower limit of the voltage range as illustrated in FIG. 22, to check whether the voltage of the upper limit or the lower limit in the range of the focus adjustment width h is the true optimum voltage.

As such, by using two types of widths as the focus adjustment width, with respect to the inspection point with heights close to the upper and lower limits of the focus width that can be inspected, the optimum voltage can be accurately determined, so that the inspection with high accuracy can be performed. That is, the optimum voltage can be searched with respect to the entire range of the focus adjustment width h.

The focus adjustment width h and the through focus allowable width h' may be dealt as first focus adjustment width $h_1$ and the second focus adjustment width $h_2$, respectively, or may be utilized by further setting a plurality of types of focus adjustment widths as the second focus adjustment value.

Although the embodiments of the present invention are specifically described above, the present invention is not limited to the above examples, and various modifications can be made without departing from the gist thereof. For example, as an example of the electron microscope, a scanning electron microscope (SEM) is exemplified, but the embodiments are not limited thereto and can be applied to other electron microscopes such as a scanning transmission electron microscope (STEM) and an electron beam application device. In the examples, the inspection device is mainly described, but the present invention can be applied to a measuring device such as a length measuring device for measuring the shape and dimensions of the sample at a plurality of locations defined in advance on the sample, other observation and analyzing devices, and the like.

What is claimed is:

1. An electron microscope comprising:
    an electron source that emits a primary electron beam;
    a lens that focuses the primary electron beam;
    a first focus adjustment unit that adjusts a height of a focus position of the primary electron beam;
    a second focus adjustment unit that adjusts the height of the focus position of the primary electron beam and is different from the first focus adjustment unit;
    a stage on which a sample is placed;
    a detector that detects a signal generated from the sample by the irradiation of the sample with the primary electron beam; and
    a control unit, wherein
    the control unit includes
        an image generation unit that generates an image from the signal acquired by the detector,
        an image acquisition point height information storage unit that stores height information of a surface at a plurality of image acquisition points of the sample, and
        a focus adjustment width storage unit that stores a focus adjustment width that can be adjusted by the first focus adjustment unit, and
    a focus adjustment amount is determined by the second focus adjustment unit based on the height information of the sample and the focus adjustment width.

2. The electron microscope according to claim 1, wherein adjustment by the first focus adjustment unit is performed at a higher speed than adjustment of the second focus adjustment unit.

3. The electron microscope according to claim 1, wherein the focus adjustment width that can be adjusted by the first focus adjustment unit is smaller than a focus adjustment width that can be adjusted by the second focus adjustment unit.

4. The electron microscope according to claim 1, wherein
the lens includes an electrostatic lens and an electromagnetic lens,
the first focus adjustment unit is the voltage adjustment unit of the electrostatic lens, and
the second focus adjustment unit is an electric current amount adjustment unit of the electromagnetic lens and/or a stage rise adjustment unit that adjusts an up and down of the stage.

5. The electron microscope according to claim 4, wherein the control unit further includes
an image acquisition order storage unit that stores an order of acquiring images at the plurality of image acquisition points of the sample, and
the focus adjustment amount by the second focus adjustment unit from the image acquisition point of which the image acquisition order is n-th (n is a natural number in the range from 1 to the number of image acquisition points) to the m-th (m is a natural number in the range from n to the number of image acquisition points) image acquisition point that is continuous according to the image acquisition order and in which the height information of the sample is in a range of the focus adjustment width is caused to be constant.

6. The electron microscope according to claim 5, wherein the focus adjustment amount by the second focus adjustment unit is an amount in which height of the focus position of the primary electron beam is adjusted to height in a center that is an average value of a minimum value and a maximum value in the height information of the n-th to m-th image acquisition points.

7. The electron microscope according to claim 4, wherein the control unit further includes
an image acquisition order storage unit that stores an order for acquiring images at the plurality of image acquisition points of the sample,
a first image acquisition order is stored in the image acquisition order storage unit in advance,
a second image acquisition order is prepared based on the height information of the sample and the focus adjustment width, and
the first and/or second image acquisition orders are stored in the image acquisition order storage unit.

8. The electron microscope according to claim 7, wherein the second image acquisition order is an order that classifies the image acquisition points of the sample into a plurality of groups so that a variation of the height information in the image acquisition points is equal to or less than the focus adjustment width in the same group, and continuously acquires images of the image acquisition points classified into the same group.

9. The electron microscope according to claim 8, wherein the control unit does not perform focus adjustment by the second focus adjustment unit at the image acquisition point of which the second image acquisition order in the same group is the second or later in the image acquisition points classified into the same group.

10. The electron microscope according to claim 7, wherein
the control unit further includes
an image and data processing unit that processes data including the image and/or the inspection signal and inspects, measures, observes, analyzes, calculates, and/or outputs the sample, and
an operation required time estimation calculation unit that estimates required time of a series of operations that performs image acquisition in the image acquisition points in the image acquisition order and a process of the image and data processing unit.

11. The electron microscope according to claim 7, wherein
the electron microscope further includes
a graphical user interface (GUI), and
the GUI includes
a display function that displays the information relating to the first and second image acquisition orders, and
a selection input function that receives an input of selecting the first or second image acquisition order.

12. The electron microscope according to claim 1, wherein
the control unit further includes
result accumulation database in which at least measurement results of heights of the image acquisition points are accumulated, and
the height information of the image acquisition points that is stored in the image acquisition point height information storage unit is updated based on the result accumulation database.

13. The electron microscope according to claim 1, wherein
the control unit includes
result accumulation database in which at least measurement results of heights of the image acquisition points are accumulated, and
the focus adjustment width is changed based on the result accumulation database.

14. The electron microscope according to claim 1, wherein
a first focus adjustment width as the focus adjustment width and a second focus adjustment width different from the first focus adjustment width are stored in the focus adjustment width storage unit.

15. A method of adjusting focus of an electron microscope, in which the electron microscope includes
an electron source that emits a primary electron beam,
a lens that focuses the primary electron beam,
a first focus adjustment unit that adjusts a height of a focus position of the primary electron beam,
a second focus adjustment unit that adjusts the height of the focus position of the primary electron beam and is different from the first focus adjustment unit,
a stage on which a sample is placed,
a detector that detects a signal generated from the sample by the irradiation of the sample with the primary electron beam, and
a control unit, and
the control unit determines a focus adjustment amount by the second focus adjustment unit based on height information of a surface at the plurality of image acquisition points of the sample and a focus adjustment width that can be adjusted by the first focus adjustment unit.

16. The method of adjusting a focus of an electron microscope according to claim 15, wherein
the control unit
stores an order of acquiring images at the plurality of image acquisition points of the sample,
causes the focus adjustment amount by the second focus adjustment unit from the image acquisition point, the image acquisition order being n-th (n is a natural number in the range from 1 to the number of image acquisition points) to the m-th (m is a natural number in the range from n to the number of image acquisition points) image acquisition point that is continuous according to the image acquisition order and in which the height information of the sample is in a range of the focus adjustment width is caused to be constant.

17. The method of adjusting a focus of an electron microscope according to claim 15, wherein
the control unit
stores a first image acquisition order for acquiring images at the plurality of image acquisition points of the sample,
prepares a second image acquisition order based on the height information of the sample and the focus adjustment width, and
stores the first and/or second image acquisition orders.

* * * * *